(12) United States Patent
Heo et al.

(10) Patent No.: US 11,262,633 B2
(45) Date of Patent: Mar. 1, 2022

(54) DISPLAY DEVICE

(71) Applicant: LG DISPLAY CO., LTD., Seoul (KR)

(72) Inventors: SeoungUk Heo, Paju-si (KR); WooYeal Jun, Paju-si (KR); JiSeon Yu, Goyang-si (KR); JiAe Yoon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 70 days.

(21) Appl. No.: 16/217,627

(22) Filed: Dec. 12, 2018

(65) Prior Publication Data

US 2019/0196238 A1    Jun. 27, 2019

(30) Foreign Application Priority Data

Dec. 22, 2017   (KR) ................. 10-2017-0178732

(51) Int. Cl.
*H01L 29/786* (2006.01)
*G02F 1/1368* (2006.01)
*G02F 1/1362* (2006.01)
*G02F 1/1343* (2006.01)
*G02F 1/1337* (2006.01)

(52) U.S. Cl.
CPC .......... *G02F 1/1368* (2013.01); *G02F 1/1362* (2013.01); *G02F 1/13624* (2013.01); *G02F 1/134336* (2013.01); *G02F 1/134363* (2013.01); *G02F 1/136209* (2013.01); *G02F 1/136227* (2013.01); *G02F 1/136286* (2013.01); *H01L 29/786* (2013.01); *G02F 1/133707* (2013.01); *G02F 1/134345* (2021.01); *G02F 1/136222* (2021.01); *G02F 2201/40* (2013.01); *G02F 2201/52* (2013.01)

(58) Field of Classification Search
CPC ............ G02F 1/1368; G02F 1/134336; G02F 1/134363; H01L 29/786
See application file for complete search history.

(56) References Cited

U.S. PATENT DOCUMENTS

| 2004/0135149 | A1 | 7/2004 | Cho et al. |
| 2010/0283714 | A1* | 11/2010 | Cho ................ G09G 3/3607 345/90 |
| 2011/0032446 | A1 | 2/2011 | Lee |
| 2011/0299024 | A1* | 12/2011 | Lee .................... G02F 1/1368 349/144 |
| 2013/0083092 | A1 | 4/2013 | Shin et al. |
| 2015/0138480 | A1 | 5/2015 | Yi et al. |

(Continued)

FOREIGN PATENT DOCUMENTS

| CN | 101881913 A | 11/2010 |
| CN | 101995721 A | 3/2011 |
| CN | 104656330 A | 5/2015 |

(Continued)

*Primary Examiner* — Errol V Fernandes
(74) *Attorney, Agent, or Firm* — Seed IP Law Group LLP

(57) ABSTRACT

Provided is a liquid-crystal display device. The liquid-crystal display device includes gate lines and data lines disposed on a substrate and overlapping with one another to define sub-pixels, two thin-film transistors disposed together in a circuit area of one of two sub-pixels next to each other in a horizontal direction among the sub-pixels; and common electrodes and pixel electrodes disposed alternately in each of the sub-pixels. The two thin-film transistors are connected to the two sub-pixels, respectively.

19 Claims, 11 Drawing Sheets

(56) References Cited

U.S. PATENT DOCUMENTS

2017/0131608 A1    5/2017  Jin

FOREIGN PATENT DOCUMENTS

| | | |
|---|---|---|
| CN | 107121861 A | 9/2017 |
| JP | 2004-212972 A | 7/2004 |
| JP | 2005-284291 A | 10/2005 |
| JP | 2008-003185 A | 1/2008 |
| JP | 2009-244884 A | 10/2009 |
| JP | 2010-009064 A | 1/2010 |
| JP | 2013-37364 A | 2/2013 |
| JP | 2016-024411 A | 2/2016 |
| KR | 10-2007-0117820 A | 12/2007 |
| KR | 10-2014-0005717 A | 1/2014 |
| KR | 10-2017-0050738 A | 5/2017 |

* cited by examiner

DISPLAY DEVICE

CROSS-REFERENCE TO RELATED APPLICATIONS

This application claims the priority of Korean Patent Application No. 10-2017-0178732 filed on Dec. 22, 2017, in the Korean Intellectual Property Office, the disclosure of which is incorporated herein by reference.

BACKGROUND

Technical Field

The present disclosure relates to a liquid-crystal display device, and more particularly, to a liquid-crystal display device having a color-filter-on TFT (COT) structure in which a color filter is formed on a thin-film transistor of an array substrate in a very large model.

Description of the Related Art

A liquid-crystal display device is driven by using optical anisotropy and polarization properties of liquid crystals. Liquid crystals are a thin and long shape and thus their molecules are arranged with directivity. The orientation of the molecules can be controlled by applying an electric field to the liquid crystals as desired.

Therefore, by adjusting the orientation of the molecules of the liquid crystals, the arrangement of the molecules of the liquid crystals is changed, and accordingly light is refracted in the direction of the orientation of the molecules of the liquid crystals due to optical anisotropy, so that image information can be displayed.

Among these, an active matrix LCD (AMLCD), in which a thin-film transistor (TFT) and a pixel electrode connected to the thin-film transistor are arranged in a matrix, has been attracting attention because of its excellent resolution and video playback capability.

A liquid-crystal display device typically includes an upper substrate on which color filters, common electrodes, and the like are formed, a lower substrate on which switching elements and pixel electrodes are formed, and liquid crystals interposed between the two substrates. In such a liquid-crystal display device, the liquid crystals are aligned by an electric field applied between the common electrode and the pixel electrode, and the characteristics, such as transmittance and aperture ratio, are excellent.

Incidentally, a technique has been proposed that a color filter formed on the upper substrate and a switching element formed on the lower substrate are formed on the same substrate. This is sometimes referred to as color-filter-on TFT (COT) structure, in which a color filter is formed on the lower substrate on which switching elements are formed. This allows the margin that is considered during a process of attaching the upper substrate to the lower substrate to be reduced, thereby improving the aperture ratio and the like.

BRIEF SUMMARY

A liquid-crystal display device having a COT structure has an advantage of improving the aperture ratio and the like by reducing a margin during the process of attaching the substrates together.

Incidentally, a color filter is stacked to form a black strip (BS) region in a circuit area at the boundary between the sub-pixels, thereby preventing leakage of light. The BS region is a non-display area in which no image is displayed, and thus the aperture ratio is reduced as the BS region is increased.

This hinders high resolution and high aperture ratio to meet the needs of customers, especially in the very large models.

The inventors of the application has devised a structure that can reduce the BS region in a very large model, based on the ideas that it is relatively easy to design the circuit in the very large model which has a relatively wide BS region and other elements can be added or disposed therein, and that the BS region of some sub-pixels can be reduced by designing the sub-pixels next to each other asymmetrically by utilizing the BS region.

That is to say, by disposing two thin-film transistors for two sub-pixels next to each other in, for example, a horizontal direction together in the circuit area of one of the two sub-pixels such that the sub-pixels are designed asymmetrically, it is possible to expand the aperture area of the other of the two sub-pixels, thereby increasing the transmittance and the aperture ratio.

In view of the above, an object of the present disclosure is to provide a liquid-crystal display device that employs a COT structure in which a color filter is formed on a TFT of an array substrate, so that transmittance and aperture ratio can be increased in a very large model.

Objects of the present disclosure are not limited to the above-mentioned objects, and other objects, which are not mentioned above, can be clearly understood by those skilled in the art from the following descriptions.

According to an aspect of the present disclosure, there is provided a liquid-crystal display device including gate lines and data lines disposed on a substrate and overlap each other to define sub-pixels; two thin-film transistors disposed together in a circuit area of one of two sub-pixels next to each other in, for example, a horizontal direction among the sub-pixels; and common electrodes and pixel electrodes disposed alternately in each of the sub-pixels, wherein the two thin-film transistors are connected to the two sub-pixels, respectively.

According to another aspect of the present disclosure, there is provided a liquid-crystal display device including gate lines and data lines disposed on a substrate and overlapping with one another to define sub-pixels; two thin-film transistors disposed together in a circuit area of one of two sub-pixels next to each other in, for example, a horizontal direction among the sub-pixels; and common electrodes and pixel electrodes disposed alternately in each of the sub-pixels, wherein the two thin-film transistors are disposed together in the circuit area of the one of the two sub-pixels whereas no thin-film transistor is disposed in a circuit area of the other of the two sub-pixels, such that the sub-pixels have an asymmetric structure.

Other detailed matters of the exemplary embodiments are included in the detailed description and the drawings.

According to an exemplary embodiment of the present disclosure, by designing the sub-pixels next to each other in, for example, the horizontal direction asymmetrically, it is possible to expand the aperture area of one of the sub-pixels, thereby increasing the transmittance (by approximately 9% or more) and the aperture ratio. Therefore, the display quality is improved in very large models.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
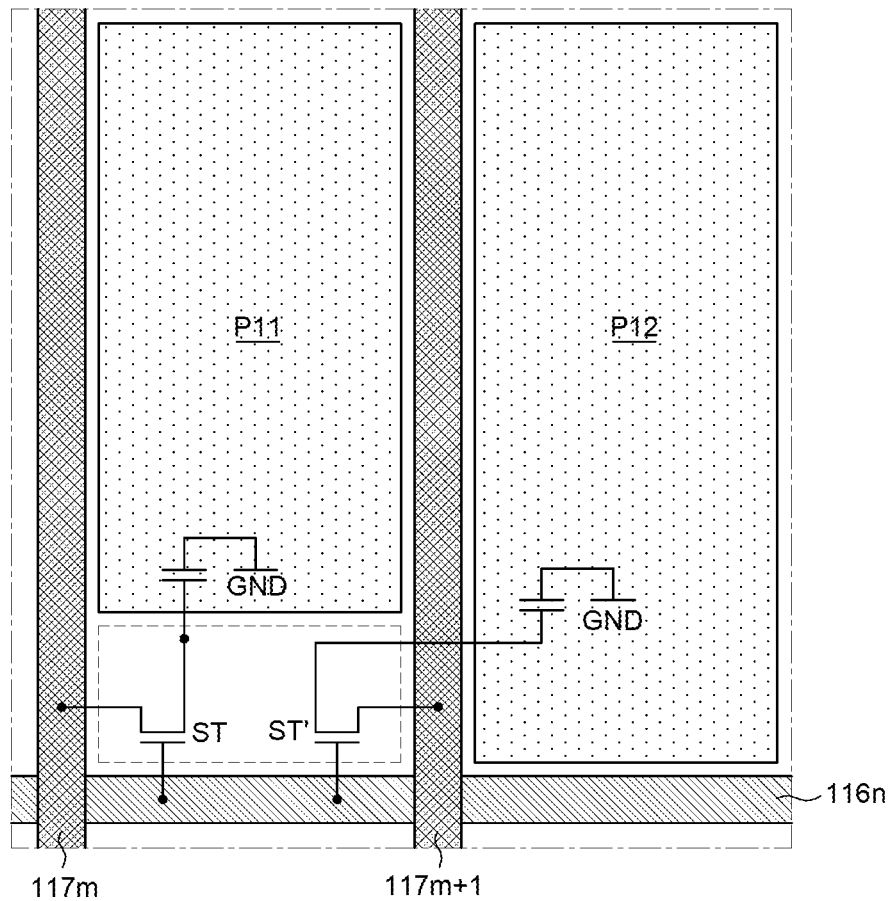
FIG. 1 is a plan view showing a liquid-crystal display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example so that those skilled in the art can fully understand the disclosures of the present disclosure and the scope of the present disclosure. Therefore, the present disclosure will be defined by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a liquid-crystal display device according to exemplary embodiments of the present disclosure will be described in detail with reference to accompanying drawings.

Figure 2:
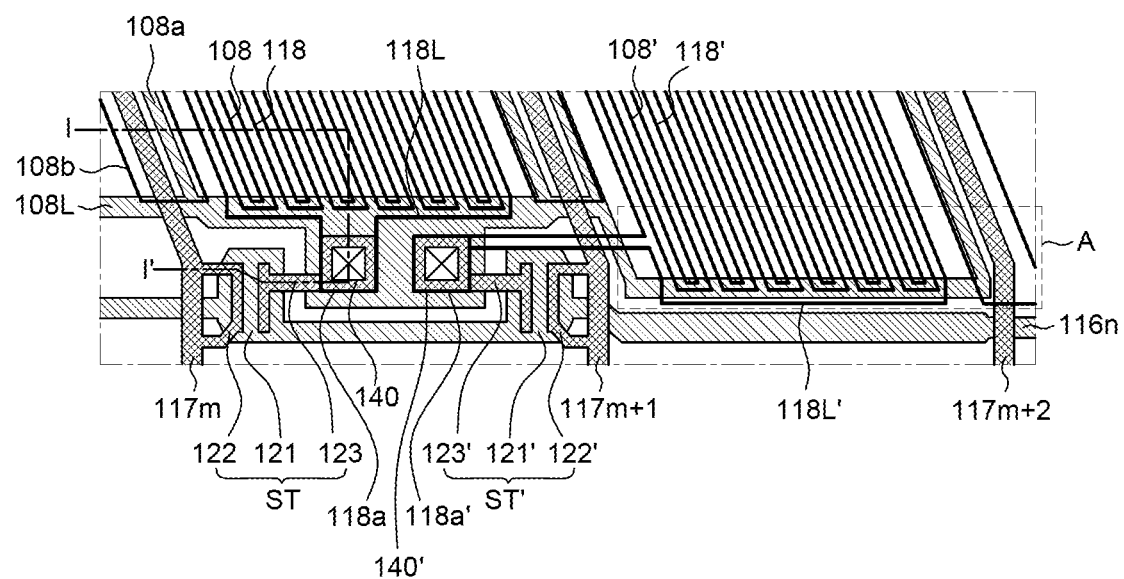
FIG. 2 is an enlarged view of a circuit part of the liquid-crystal display device according to the exemplary embodiment shown in FIG. 1.
Figure 3:
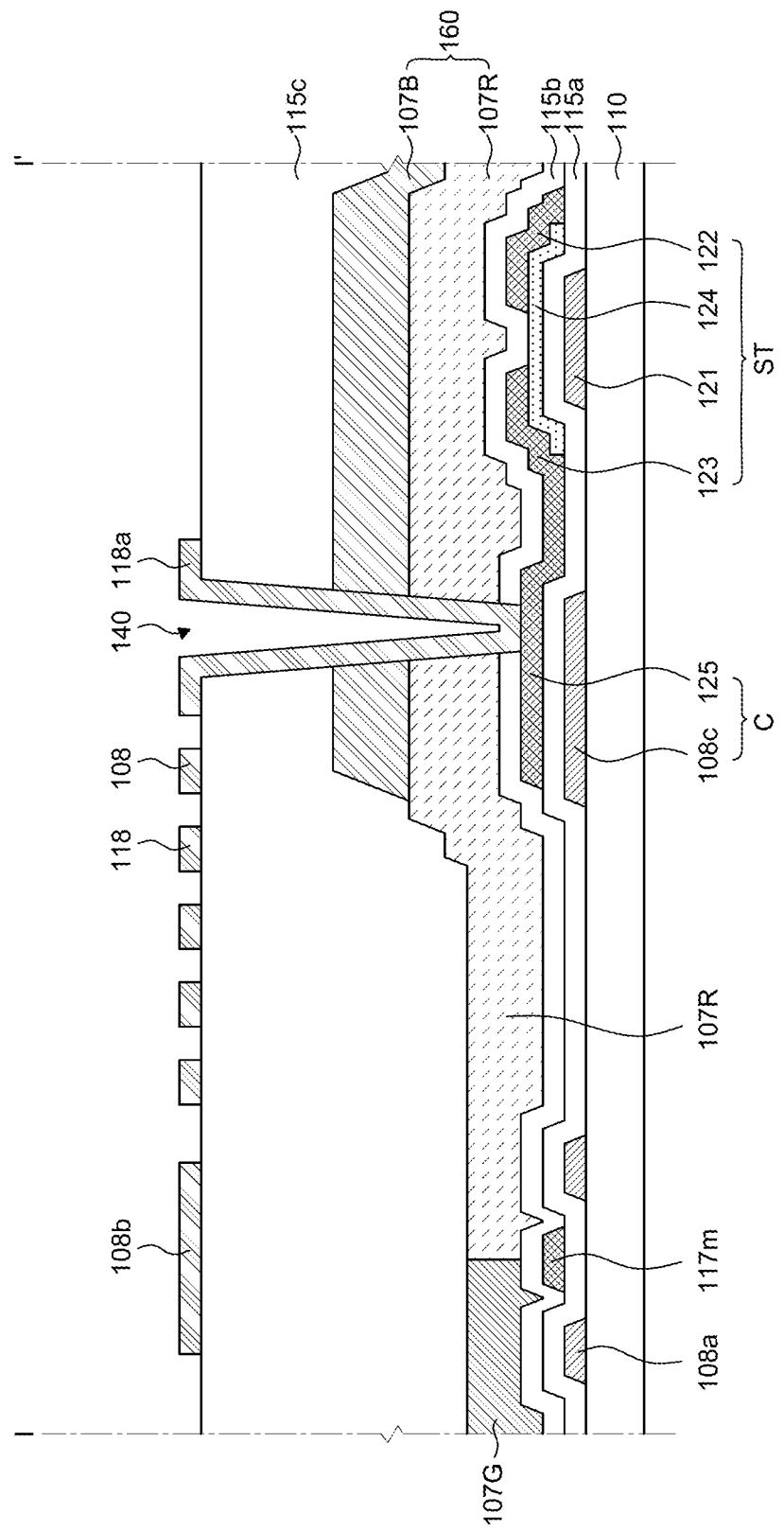
FIG. 3 is a cross-sectional view of the liquid-crystal display device according to the exemplary embodiment shown in FIG. 2, taken along line I-I.

FIG. 1 is a plan view showing a liquid-crystal display device according to an exemplary embodiment of the present disclosure. FIG. 2 is an enlarged view of a circuit area of the liquid-crystal display device according to the exemplary embodiment shown in FIG. 1. FIG. 3 is a cross-sectional view of the liquid-crystal display device according to the exemplary embodiment shown in FIG. 2, taken along line I-I'.

FIG. 1 shows a planar structure of two (=2×1) sub-pixels P11 and P12 in the liquid-crystal display device 100 according to the exemplary embodiment of the present disclosure. It is to be understood that this is merely illustrative.

Referring to FIGS. 1 to 3, according to an exemplary embodiment of the present disclosure, there is provided a liquid-crystal display device 100 having a color-filter-on TFT (COT) structure in which color filters 107R, 107G and 107B are formed on a lower substrate 110.

In the liquid-crystal display device 100 having the COT structure, since the color filters 107R, 107G and 107B are formed on the lower substrate 110 on which the switching elements are formed, and it is possible to reduce a margin considered during the process of attaching the upper substrate to the lower substrate 110, thereby improving the aperture ratio.

According to the exemplary embodiment of the present disclosure, the liquid-crystal display device 100 may include a plurality of sub-pixels P11 and P12. Hereinafter, the two (=2×1) sub-pixels P11 and P12 shown in FIG. 1 will be described for convenience of illustration. It is, however, to be understood that the present disclosure is not limited thereto.

A gate line 116n may overlap with data lines 117m, 117(m+1), and 117(m+2) on the lower substrate 110 such that the sub-pixels P11 and P12 are arranged in a matrix. The plurality of sub-pixels may be arranged in a row direction and a column direction in a matrix. For example, FIG. 1 shows an example in which a plurality of sub-pixels P11 and P12 are arranged in one row and two columns. That is to say, although FIG. 1 shows two (=2×1) of the plurality of sub-pixels, i.e., the sub-pixels P11 and P12 as an example, the present disclosure is not limited thereto. In the following description, for convenience of illustration, the group of sub-pixels arranged in the row direction are defined as row sub-pixels, and the group of sub-pixels arranged in the column direction are defined as column sub-pixels.

Each of the plurality of sub-pixels P11 and P12 may produce light of a particular color. For example, each of the plurality of sub-pixels P11 and P12 may include a red sub-pixel for producing red light, a green sub-pixel for producing green light, or a blue sub-pixel for producing blue light. A group of a red sub-pixel, a green sub-pixel and a blue sub-pixel may be referred to as one pixel. It is, however, to be understood that the present disclosure is not limited thereto. A plurality of sub-pixels may include a red sub-pixel, a green sub-pixel, a blue sub-pixel and a white sub-pixel.

Each of the sub-pixels P11 and P12 may be electrically coupled to the gate line 116n and the data lines 117m, 117(m+1) and 117(m+2). Specifically, the sub-pixels in the first row may be electrically coupled to the first gate line, and the sub-pixels in the first column may be electrically coupled to the first data line and the second data line alternately. Further, the sub-pixels in the second to $n^{th}$ rows may be electrically coupled to the second to $n^{th}$ gate lines, respectively. The sub-pixels in the second column may be electrically coupled to the second data line and the third data line alternately, the sub-pixels in the $m^{th}$ column may be electrically coupled to the $m^{th}$ data line and the $(m+1)^{th}$ data line alternately, and so on. For example, referring to FIG. 1, the sub-pixels P11 and P12 in the $n^{th}$ row may be electrically coupled to the $n^{th}$ gate line 116n. The sub-pixel P11 in the $m^{th}$ column may be electrically coupled to the $m^{th}$ data line 117m and the $(m+1)^{th}$ data line 117(m+1) alternately. The sub-pixel P22 in the $(m+1)^{th}$ column may be electrically coupled to the $(m+1)^{th}$ data line 117(m+1) and the $(m+2)^{th}$ data line 117(m+2) alternately. It is, however, to be understood that the present disclosure is not limited thereto.

The plurality of sub-pixels P11 and P12 may be operated based on the gate voltage transmitted from the gate line 116n and the data voltage transmitted from the data lines 117m, 117(m+1), and 117(m+2).

The gate line 116n may be disposed on the lower substrate 110 and may extend in a first direction. The data lines 117m, 117(m+1) and 117(m+2) may extend in a second direction intersecting the first direction to define or separate the sub-pixels P11 and P12 from one another together with the gate line 116n.

Although the $n^{th}$ gate line 116n, together with the $m^{th}$ data line 117m and the $(m+1)^{th}$ data line 117(m+1), defines the two (=2×1) sub-pixels P11 and P12 in FIG. 1, this is merely illustrative.

The sub-pixels P11 and P12 may include thin-film transistors ST and ST'. Specifically, the thin-film transistors ST and ST', as switching elements, may be disposed adjacent to where the gate line 116n and the data lines 117m, 117(m+1) and 117(m+2) overlap. In particular, in the liquid-crystal display device 100 according to the exemplary embodiment of the present disclosure, two thin-film transistors ST and ST' for the two sub-pixels P11 and P12 next to each other in the horizontal direction, respectively, are disposed in a circuit area of one of the two sub-pixels P11 and P12, such that the sub-pixels P11 and P12 are asymmetrically designed. For example, as shown in FIG. 1, the sub-pixel P11 has a first size, and the sub-pixel P12 has a second size that is larger than the first size.

In the following description, the sub-pixel P11 located on the left side in FIGS. 1 and 2 will be referred to as a first sub-pixel, while the sub-pixel P12 located on the right side in FIGS. 1 and 2 will be referred to as a second sub-pixel. In addition, the thin-film transistor ST for the first sub-pixel P11 is referred to as a first thin-film transistor, while the thin-film transistor ST' for the second sub-pixel P12 is referred to as a second thin-film transistor. An example will be described, where the first and second thin-film transistors ST and ST' are disposed in the circuit area of the first sub-pixel P11 for convenience of illustration.

For example, the first thin-film transistor ST may include a first gate electrode 121 electrically coupled to an $n^{th}$ gate line 116n, a first source electrode 122 electrically coupled to an $m^{th}$ data line 117m, a first drain electrode 123 electrically coupled to a first pixel electrode 118, and a first active layer 124. In addition, the second thin-film transistor ST' may include a second gate electrode 121' electrically coupled to the $n^{th}$ gate line 116n, a second source electrode 122' electrically coupled to an $(m+1)^{th}$ data line 117(m+1), a second drain electrode 123' connected to a second pixel electrode 118', and a second active layer.

Common electrodes 108 and pixel electrodes 118 are alternately arranged in the sub-pixel, and common electrodes 108' and pixel electrodes 118' are alternately arranged in the sub-pixel P12, such that a lateral electric field (horizontal electric field) can be generated in the liquid-crystal layer.

The gate line 116n for supplying a gate signal and the data lines 117m, 117(m+1), and 117(m+2) for supplying data signals (pixel signals) overlap each other to form the sub-pixels P11 and P12.

The first and second thin-film transistors ST and ST' may be disposed together in one of the sub-pixels P11 and P12. For example, as shown in FIGS. 1 and 2, the first and second thin-film transistors ST and ST' may be disposed next to each other in the horizontal direction, in the circuit area of the first sub-pixel P11. In other words, as described above, according to the exemplary embodiment of the present disclosure, the first and second thin-film transistors ST and ST' for the two sub-pixels P11 and P12 next to each other in the horizontal direction, respectively, are disposed together in a circuit area of one of the two sub-pixels P11 and P12, such that the sub-pixels P11 and P12 are asymmetrically designed.

Further, referring to FIG. 3, a capacitor C may also be disposed in the circuit area of the first sub-pixel P11 in which the first and second thin-film transistors ST and ST' are disposed together. Specifically, according to the exemplary embodiment of the present disclosure, the first sub-pixel P11 and the second sub-pixel P12 may share a lower storage electrode 108c as the lower electrode of the capacitor C. For example, the capacitor C of the first sub-pixel P11 may include the lower storage electrode 108c and the upper storage electrode 125 with the gate insulating layer 115a therebetween. The lower storage electrode 108c may protrude or extend from the common line 108L, and the upper storage electrode 125 may be extended from the drain electrode 123.

Therefore, the gate line 116n, but neither the circuit elements, such as the second thin-film transistor ST', nor the capacitor, may be disposed in the circuit area of the second sub-pixel P12. As a result, the aperture area can be increased by the area equal to the area occupied by the circuit elements and the capacitor (as indicated by portion A in FIG. 2). Accordingly, for example, the transmittance of a very large model can be improved by approximately 9% or more.

The first and second thin-film transistors ST and ST' allow the pixel electrodes 118 and 118' to be charged with the pixel signals from the data lines 117m, 117(m+1), and 117(m+2) in response to the gate signal from the gate line 116n. To this end, the first thin-film transistor ST may include a first gate electrode 121 electrically coupled to the $n^{th}$ gate line 116n, a first source electrode 122 electrically coupled to the $m^{th}$ data line 117m, and a first drain electrode 123 disposed opposite to the source electrode 122. In addition, the second thin-film transistor ST' may include a second gate electrode 121' electrically coupled to the $n^{th}$ gate line 116n, a second source electrode 122' electrically coupled to the $(m+1)^{th}$ data line 117(m+1), and a second drain electrode 123' disposed opposite to the source electrode 122'.

In addition, the first thin-film transistor ST may include a first active layer 124 that overlaps with the first gate electrode 121 with a gate insulating layer 115a therebetween, to form a channel between the first source electrode 122 and the first drain electrode 123. An ohmic contact layer may be further formed on the active layer 124 except for the channel for ohmic contact between the first source electrode 122 and the first drain electrode 123. In addition, the second thin film transistor ST' may include a second active layer that overlaps with the second gate electrode 121' with the gate insulating layer 115a therebetween, to form a channel between the second source electrode 122' and the second drain electrode 123'. An ohmic contact layer may be further formed on the second active layer except for the channel for ohmic contact between the second source electrode 122' and the second drain electrode 123'.

A protective layer 115b is formed on the first and second thin-film transistors ST and ST'. Color filters 107R, 107G and 107B in which the red, blue and green color filters 107R, 107G and 107B are arranged sequentially may be formed on the protective layer 115b.

The circuit area between sub-pixels adjacent to each other in, for example, a vertical direction, i.e., the BS region, may further include a light-blocking layer 160 composed of at least one color filter 107R, 107G and 107B. For example, referring to FIG. 3, the light-blocking layer 160 may be formed by stacking a blue color filter 107B on a red color filter 107R. It is, however, to be understood that the present disclosure is not limited thereto. In FIGS. 1 and 2, the color filters 107R, 107G and 107B are not shown for convenience of illustration.

As shown in FIG. 3, a planarization layer 115c may be formed above the lower substrate 110 on which the color filters 107R, 107G and 107B and the light-blocking layer 160 are formed, so that it covers the light-blocking layer 160.

The planarization layer 115c may be implemented as an overcoat layer formed using a resin composition for protecting the color filters 107R, 107G, and 107B and providing a flat surface over them.

According to an exemplary embodiment of the present disclosure, a part of each of the planarizing layer 115c, the protective layer 115b, and the light-blocking layer 115b of the circuit area of the first sub-pixel P11 where the first and second thin-film transistors ST and ST' are disposed may be selectively removed, to form a first contact hole 140 and a second contact hole 140', via which the first drain electrode 123 and the first drain electrode 123' are partially exposed, respectively.

In the liquid-crystal display device 100 according to the exemplary embodiment of the present disclosure, a first pixel electrode connection portion 118a is connected to the first drain electrode 123 through the first contact hole 140, and accordingly the first pixel electrode 118 may be electrically connected to the first drain electrode 123. In addition, in the liquid-crystal display device 100 according to the exemplary embodiment of the present disclosure, a second pixel electrode connection portion 118a' is connected to the second drain electrode 123' through the second contact hole 140', and accordingly the second pixel electrode 118' may be electrically connected to the second drain electrode 123'.

The first pixel electrode connection portion 118a may protrude or extend from the first pixel electrode line 118L connected to one end of the first pixel electrode 118 toward the circuit area, to overlap the first drain electrode 123. On the other hand, the second pixel electrode connection portion 118a' may be extended from the second second pixel electrode line 118L' connected to one end of the second pixel electrode 118' toward the first sub-pixel P11, to overlap the second drain electrode 123'.

Accordingly, the second pixel electrode connection portion 118a' of the second sub-pixel P12 may be extended toward the first sub-pixel P11 via the $(m+1)^{th}$ data line 117(m+1). That is to say, when the first and second thin-film transistors ST and ST' are disposed in the circuit area of the first sub-pixel P11 among the sub-pixels P11 and P12 next to each other in the horizontal direction, the first pixel electrode connection portion 118a protrudes from the first pixel electrode line 118L toward the circuit area and is electrically connected to the first drain electrode 123, while the second pixel electrode connection portion 118a' protrudes from toward the first sub-pixel P11 and is electrically connected to the second drain electrode 123'.

As such, the first contact hole 140 for connecting the first pixel electrode connection portion 118a with the first drain electrode 123 and the second contact hole 140' for connecting the second pixel electrode connection portion 118a' with the second drain electrode 123' may be formed together in the circuit area of one of the sub-pixels P11 and P12 next to each other in the horizontal direction.

The pixel electrodes 118 and 118' may be disposed alternately with the common electrodes 108 and 108' in the sub-pixels P11 and P12, respectively, to form a lateral electric field. It is to be noted that the second pixel electrode 118' and the second common electrode 108' of the second sub-pixel P12 may be longer than the first pixel electrode 118 and the first common electrode 108 of the first sub-pixel P11 because no circuit element is disposed in the second sub-pixel P12 except for the gate line 116n.

The common line 108L and the common electrodes 108 and 108' may supply a reference voltage for driving the liquid crystals.

The common line 108L may be disposed on the upper side or the lower side of each of the sub-pixels P11 and P12, and may be disposed in a direction parallel to the gate line 116n. The common line 108L may be disposed, for example, between the lower side of each of the sub-pixels P11 and P12 and the gate line 116n, but the present disclosure is not limited thereto.

The first light-blocking line 108a may be disposed on one side of the data lines 117m, 117(m+1) and 117(m+2), and the first light-blocking line 108a may be connected to the common line 108L. The first light-blocking line 108a may block the interference of the data signal to the lateral electric field.

The second light-blocking line 108b may be disposed on the data lines 117m, 117(m+1) and 117(m+2).

The plurality of common electrodes 108 and 108' may be disposed in the sub-pixels P11 and P12 in the form of a finger or a herringbone together with the plurality of pixel electrodes 118 and 118'. It is, however, to be understood that the present disclosure is not limited thereto. The common electrodes 108 and 108' may be disposed in a linear shape in the vertical direction or the horizontal direction.

As a result, the lateral electric field may be formed between the pixel electrodes 118 and 118' to which the pixel signals are supplied through the thin-film transistors and the common electrodes 108 and 108' to which the reference voltage is supplied through the common line 108L. Liquid crystal molecules aligned in the horizontal direction between the pixel electrodes 118 and 118' and the common electrodes 108 and 108' may be rotated by dielectric anisotropy as the lateral electric field is applied.

The gate line 116n may be electrically coupled to the gate driver via a gate pad. The data lines 117m, 117(m+1) and 117(m+2) may be electrically coupled to the data driver via a data pad.

The liquid-crystal display device 100 having the COT structure according to the exemplary embodiment of the present disclosure has an advantage that the margin during the process of attaching the substrates is reduced and thus the aperture ratio and the like can be improved.

In addition, as the color filters 107R, 107G and 107B are stacked, the light-blocking layer 160 is formed at the boundary between the sub-pixels next to each other in the vertical direction, i.e., a BS region, to prevent leakage of light. The BS region is a non-display area in which no image is displayed, and thus the aperture ratio is reduced as the BS region is increased.

This hinders high resolution and high aperture ratio to meet the needs of customers, especially in the very large models.

According to an exemplary embodiment of the present disclosure, a structure that can reduce the BS region in a very large model is disclosed, based on the ideas that it is relatively easy to design the circuit in the very large model which has a relatively wide BS region and other elements can be added or disposed therein, and that the BS region of some sub-pixels can be reduced by designing the sub-pixels next to each other asymmetrically by utilizing the BS region.

In other words, for example, two thin-film transistors ST and ST' for two sub-pixels P11 and P12 next to each other in the horizontal direction, respectively, are disposed together in a circuit area of one of the two sub-pixels P11 and P12, such that the sub-pixels are designed asymmetrically. Accordingly, the aperture area of the other sub-pixel, e.g., the second sub-pixel P12 can be expanded (see portion A of FIG. 2), the transmittance and the aperture ratio can be increased. For example, the transmittance of a very large model can be improved by approximately 9% or more.

Figure 4:
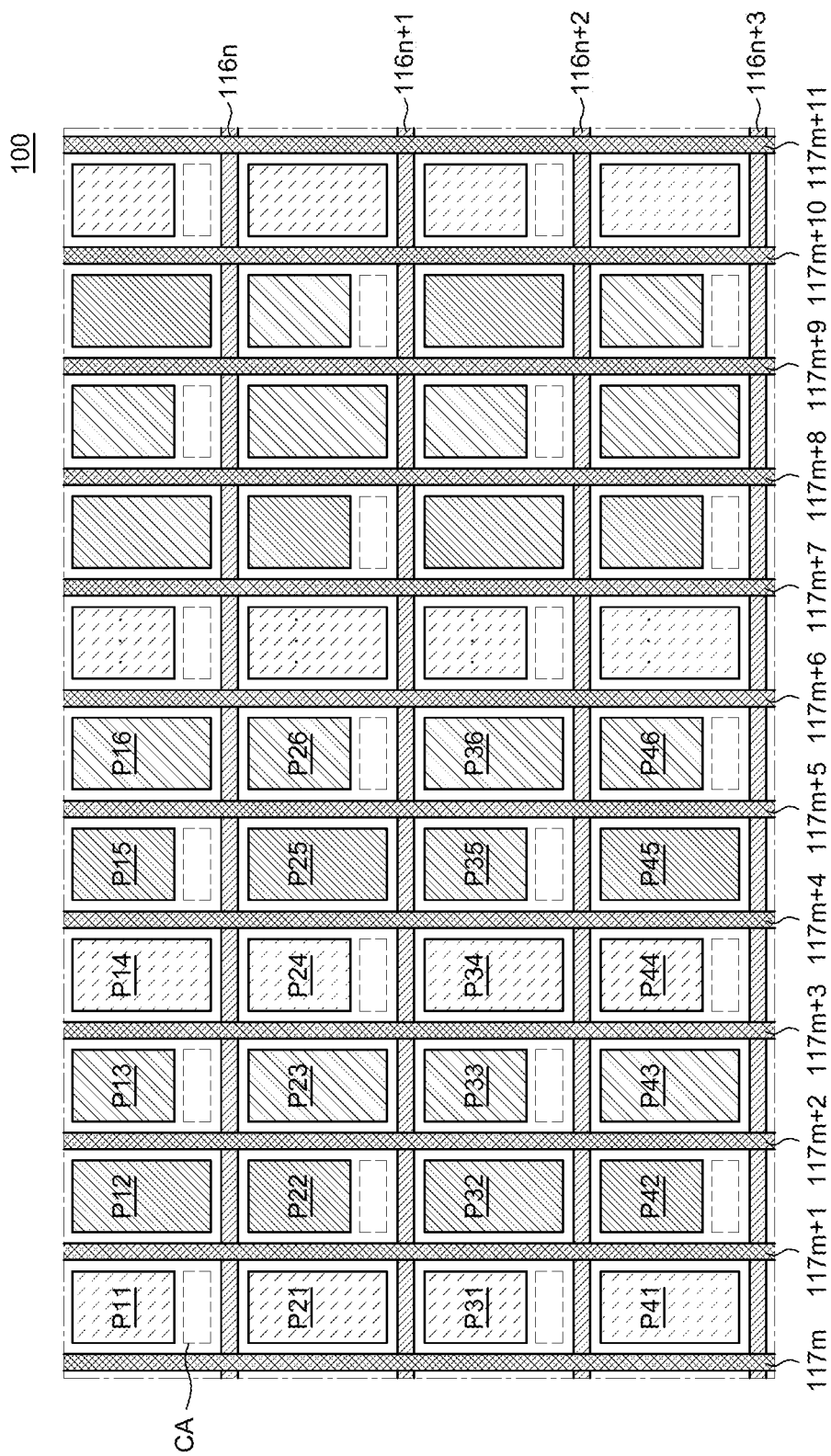
FIG. 4 is a plan view showing an example of a pixel structure in a liquid-crystal display device according to an exemplary embodiment of the present disclosure.

FIG. 4 is a plan view showing an example of a pixel structure in a liquid-crystal display device according to an exemplary embodiment of the present disclosure.

Figure 5:
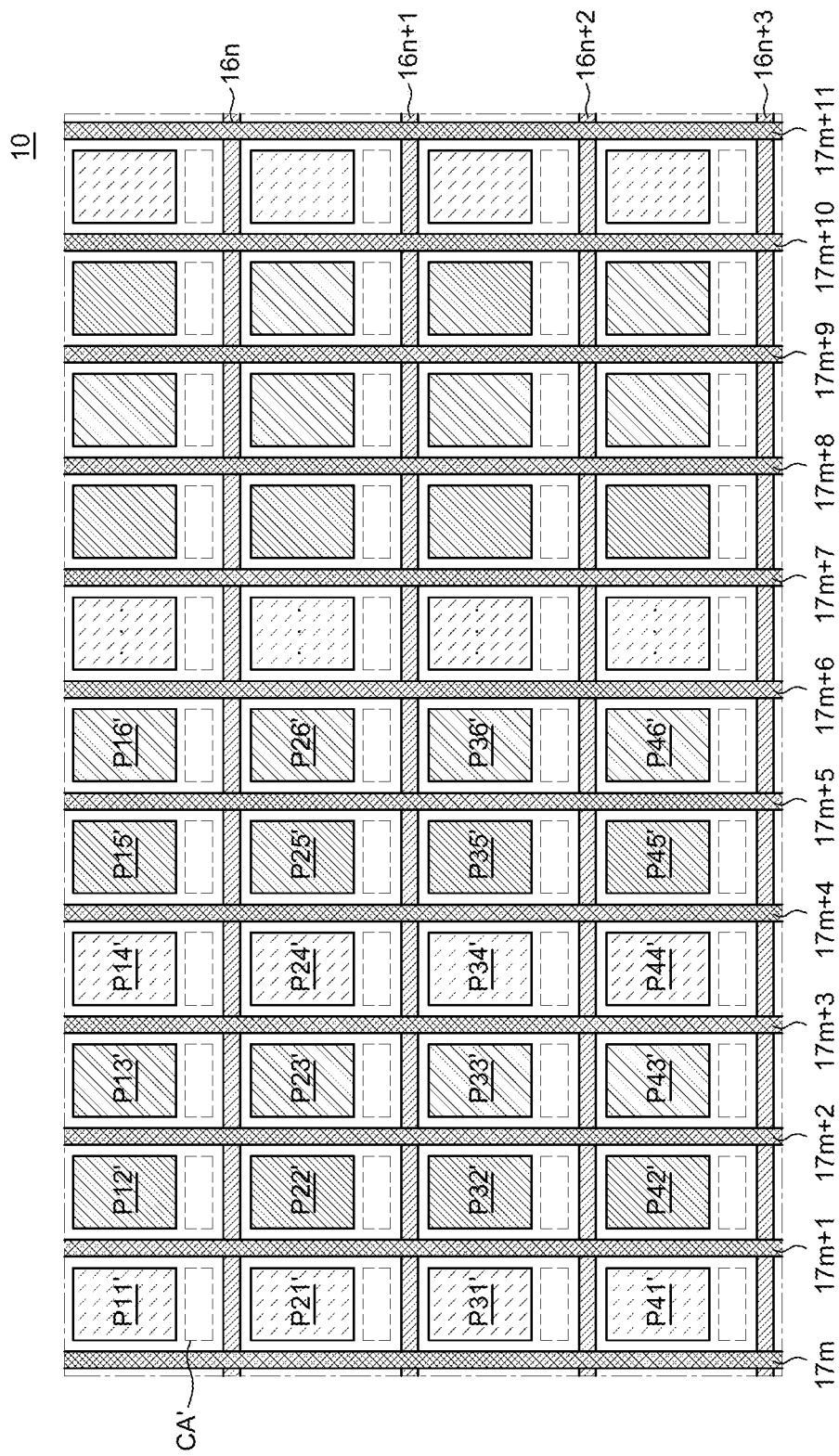
FIG. 5 is a plan view showing an example of a pixel structure in a liquid-crystal display device according to a Comparative Example.

FIG. 5 is a plan view showing an example of a pixel structure in a liquid-crystal display device according to a Comparative Example.

Figure 6:
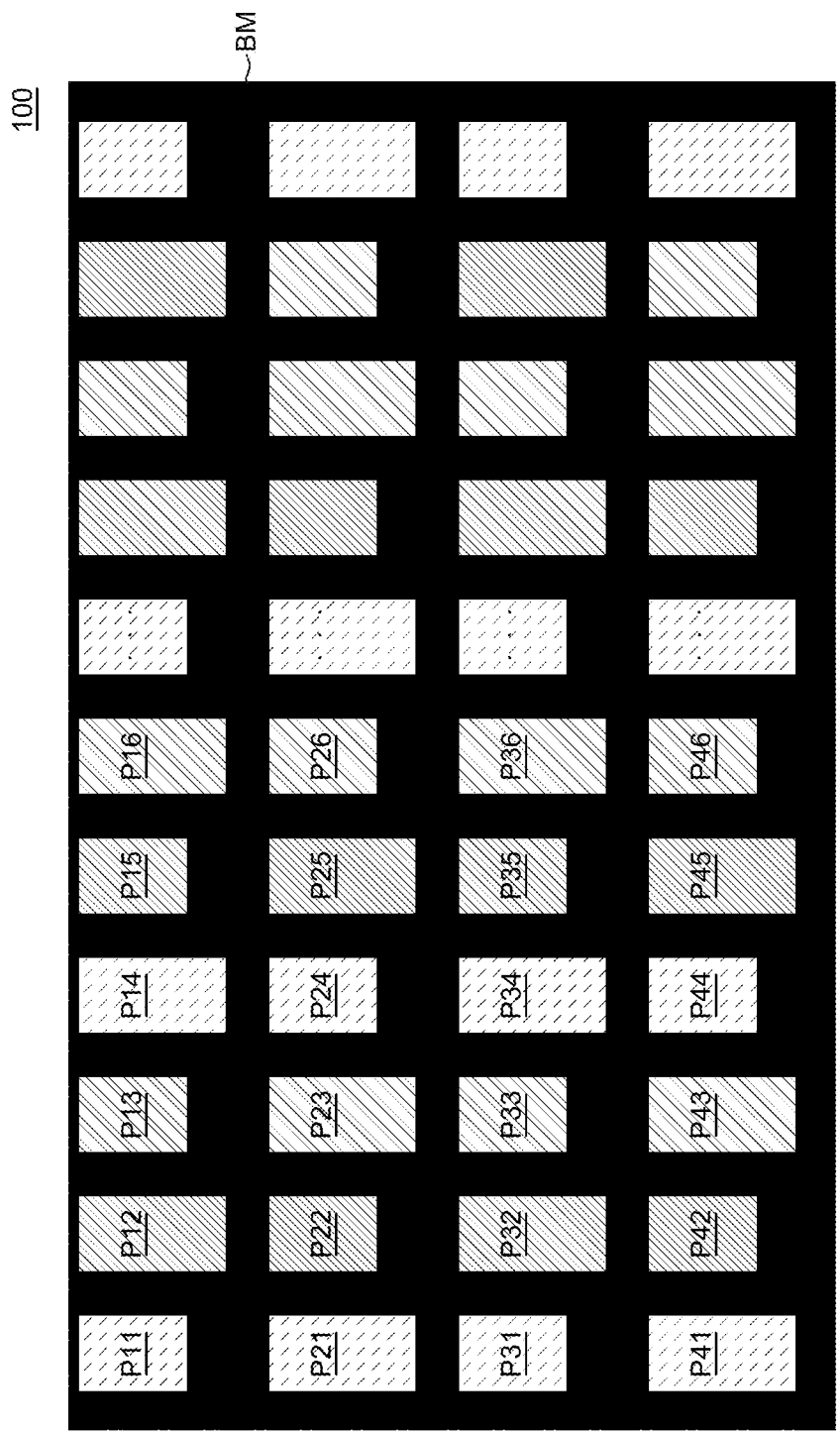
FIG. 6 is a plan view showing an example of a black matrix structure in a liquid-crystal display device according to an exemplary embodiment of the present disclosure.
Figure 7:
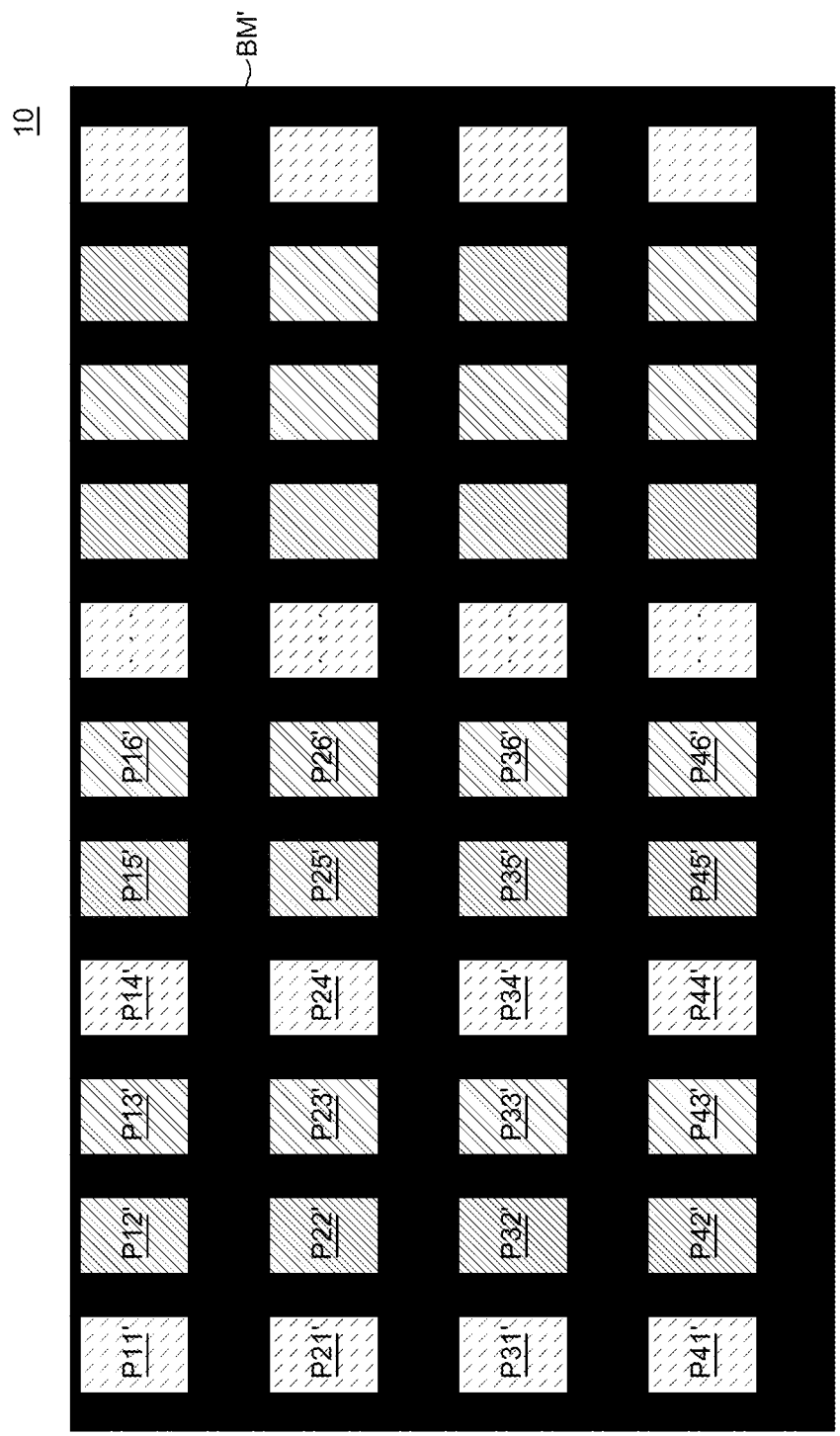
FIG. 7 is a plan view showing an example of a black matrix structure in a liquid-crystal display device according to a Comparative Example.

FIG. 6 is a plan view showing an example of a black matrix structure in a liquid-crystal display device according to an exemplary embodiment of the present disclosure. FIG. 7 is a plan view showing an example of a black matrix structure in a liquid-crystal display device according to the Comparative Example of FIG. 5.

FIG. 4 shows a planar structure of 44 (=11×4) sub-pixels (P11, P12, P13, P14, P15, P16, ..., P21, P22, P23, P24, P25, P26, ..., P31, P32, P33, P34, P35, P36, ..., P41, P42, P43, P44, P45, P46, ...) in a liquid-crystal display device 100 according to an exemplary embodiment of the present disclosure. It is, however, to be understood that the present disclosure is not limited thereto. FIG. 5 shows a planar structure of 44 (=11×4) sub-pixels (P11', P12', P13', P14', P15', P16', ..., P21' P22', P23', P24', P25', P26', ..., P31', P32', P33', P34', P35', P36', ..., P41', P42', P43', P44', P45', P46', ...) in a liquid-crystal display device according to the Comparative Example.

It is to be noted that among the sub-pixels (P11, P12, P13, P14, P15, P16, ..., P21, P22, P23, P24, P25, P26, ..., P31, P32, P33, P34, P35, P36, ..., P41, P42, P43, P44, P45, P46, ...,), sub-pixels having the same hatching produce the light of the same color. FIG. 4 shows an example where the sub-pixels (P11, P12, P13, P14, P15, P16, ..., P21, P22, P23, P24, P25, P26, ..., P31, P32, P33, P34, P35, P36, ..., P41, P42, P43, P44, P45, P46, ...) include red sub-pixels, green sub-pixels and blue sub-pixels.

FIG. 6 shows a black matrix (BM) structure of 44 (=11×4) sub-pixels (P11', P12', P13', P14', P15', P16', ..., P21' P22', P23', P24', P25', P26', ..., P31', P32', P33', P34', P35', P36', ..., P41', P42', P43', P44', P45', P46', ...) in the liquid-crystal display device 10 according to the exemplary embodiment of the present disclosure. It is, however, to be understood that the present disclosure is not limited thereto. FIG. 7 shows a black matrix (BM') structure of 44 (=11×4) sub-pixels (P11', P12', P13', P14', P15', P16', ..., P21' P22', P23', P24', P25', P26', ..., P31', P32', P33', P34', P35', P36', ..., P41', P42', P43', P44', P45', P46', ...) in a liquid-crystal display device according to the Comparative Example of FIG. 5.

Referring to FIG. 4, a liquid-crystal display device 100 according to an exemplary embodiment of the present disclosure may include a plurality of sub-pixels (P11, P12, P13, P14, P15, P16, ..., P21, P22, P23, P24, P25, P26, ..., P31, P32, P33, P34, P35, P36, ..., P41, P42, P43, P44, P45, P46, ...). In the following description, 44 (=11×4) sub-pixels (P11, P12, P13, P14, P15, P16, ..., P21, P22, P23, P24, P25, P26, ..., P31, P32, P33, P34, P35, P36, ..., P41, P42, P43, P44, P45, P46, ...) will be described for convenience of illustration. It is, however, to be understood that the present disclosure is not limited thereto.

The sub-pixels (P11, P12, P13, P14, P15, P16, ..., P21, P22, P23, P24, P25, P26, ..., P31, P32, P33, P34, P35, P36, ..., P41, P42, P43, P44, P45, P46, ...) may be disposed in a matrix as the gate lines 116n, 116(n+1), 116(n+2) and 116(n+3) and the data lines 117m, 117(m+1), 117(m+2), 117(m+3), 117(m+4), 117(m+5), 117(m+6), 117(m+7), 117(m+8), 117(m+9), 117(m+10) and 117(m+11) overlap one another on the lower substrate.

The gate lines 116n, 116(n+1), 116(n+2) and 116(n+3) are arranged on the lower substrate in the first direction. The data lines 117m, 117(m+1), 117(m+2), 117(m+3), 117(m+4), 117(m+5), 117(m+6), 117(m+7), 117(m+8), 117(m+9), 117(m+10) and 117(m+11) are arranged in the second direction intersecting the first direction to define the sub-pixels (P11, P12, P13, P14, P15, P16, ..., P21, P22, P23, P24, P25, P26, ..., P31, P32, P33, P34, P35, P36, ..., P41, P42, P43, P44, P45, P46, ...) together with the gate lines 116n, 116(n+1), 116(n+2) and 116(n+3).

In the liquid-crystal display device 100 according to the exemplary embodiment of the present disclosure, red sub-pixels, green sub-pixels and blue sub-pixels may be arranged repeatedly and sequentially in each of the rows. For example, the sub-pixels P11, P12, P13, P14, P15, P16, ... in the $n^{th}$ row may be the red sub-pixels P11, P14, ..., the green sub-pixels P12, P15, ..., and the blue sub-pixels P13, P16, ..., arranged repeatedly and sequentially. It is, however, to be understood that the present disclosure is not limited thereto.

On the other hand, the sub-pixels in the same column may be the sub-pixels of the same color, e.g., red sub-pixels, green sub-pixels or blue sub-pixels arranged repeatedly. For example, the red sub-pixels P11, P21, P31 and P41 are arranged in the $m^{th}$ column. It is, however, to be understood that the present disclosure is not limited thereto.

In the liquid-crystal display device 100 according to the exemplary embodiment of the present disclosure, two thin-film transistors for two sub-pixels next to each other in, for example, the horizontal direction among the sub-pixels (P11, P12, P13, P14, P15, P16, ..., P21, P22, P23, P24, P25, P26, ..., P31, P32, P33, P34, P35, P36, ..., P41, P42, P43, P44, P45, P46, ...) are disposed together in the circuit area CA of one of the two adjacent sub-pixels, such that the sub-pixels are designed asymmetrically. By doing so, the aperture area of the other of the two adjacent sub-pixels where no thin-film transistor is disposed can be increased by the area equal to the circuit area CA. For example, comparing FIGS. 6 and 7, it can be seen that the width or area of the black matrix BM decreases when two thin-film transistors for two adjacent sub-pixels are disposed together in the circuit area CA of one of the two adjacent sub-pixels.

Such asymmetric structure of the sub-pixels (P11, P12, P13, P14, P15, P16, ..., P21, P22, P23, P24, P25, P26, ..., P31, P32, P33, P34, P35, P36, ..., P41, P42, P43, P44, P45, P46, ...) may be repeated in the same row sub-pixels and also in the same column sub-pixels. As a result, it is possible to avoid the effect of increasing the aperture area from being limited to sub-pixels of a particular color. That is to say, as shown for example in FIG. 4, in the $m^{th}$ column, the circuit area of the red sub-pixels P11 and P31 sharing the circuit area is reduced, such that the red sub-pixels P21 and P41 with increased aperture area may be arranged alternately and repeatedly.

Referring to FIG. 5, in the liquid-crystal display device 10 according to the Comparative Example, the sub-pixels (P11', P12', P13', P14', P15', P16', ..., P21', P22', P23', P24', P25', P26', ..., P31', P32', P33', P34', P35', P36', ..., P41', P42', P43', P44', P45', P46', ...) may be disposed in a matrix as the gate lines 16n, 16(n+1), 16(n+2), 16(n+3) and the data lines 17m, 17(m+1), 17(m+2), 17(m+3), 17(m+4), 17(m+5), 17(m+6), 17(m+7), 17(m+8), 17(m+9), 17(m+10) and 17(m+11) overlap one another on the lower substrate.

In the liquid-crystal display device according to the Comparative Example of FIG. 5, it can be seen that a thin-film transistor is disposed in each of the sub-pixels (P11', P12', P13', P14', P15', P16', ..., P21', P22', P23', P24', P25', P26', ..., P31', P32', P33', P34', P35', P36', ..., P41', P42', P43', P44', P45', P46', ...), such that the circuit area CA' is disposed in every sub-pixel. That is to say, the circuit area CA' has a symmetric structure. Stated differently, the sub-pixels (P11', P12', P13', P14', P15', P16', ..., P21', P22', P23', P24', P25', P26', ..., P31', P32', P33', P34', P35', P36', ..., P41', P42', P43', P44', P45', P46', ...) are substantially the same size. In this structure, as shown for example in FIG. 7, it can be seen that the aperture area is reduced by the area equal to the circuit area CA', and accordingly the width or the area of the black matrix BM' is increased. As a result, the aperture ratio and the transmittance are decreased.

A single pixel may further include a white sub-pixel in addition to the red sub-pixel, the green sub-pixel and the blue sub-pixel in order to improve brightness, which will be described below with respect to another exemplary embodiment of the present disclosure.

Figure 8:
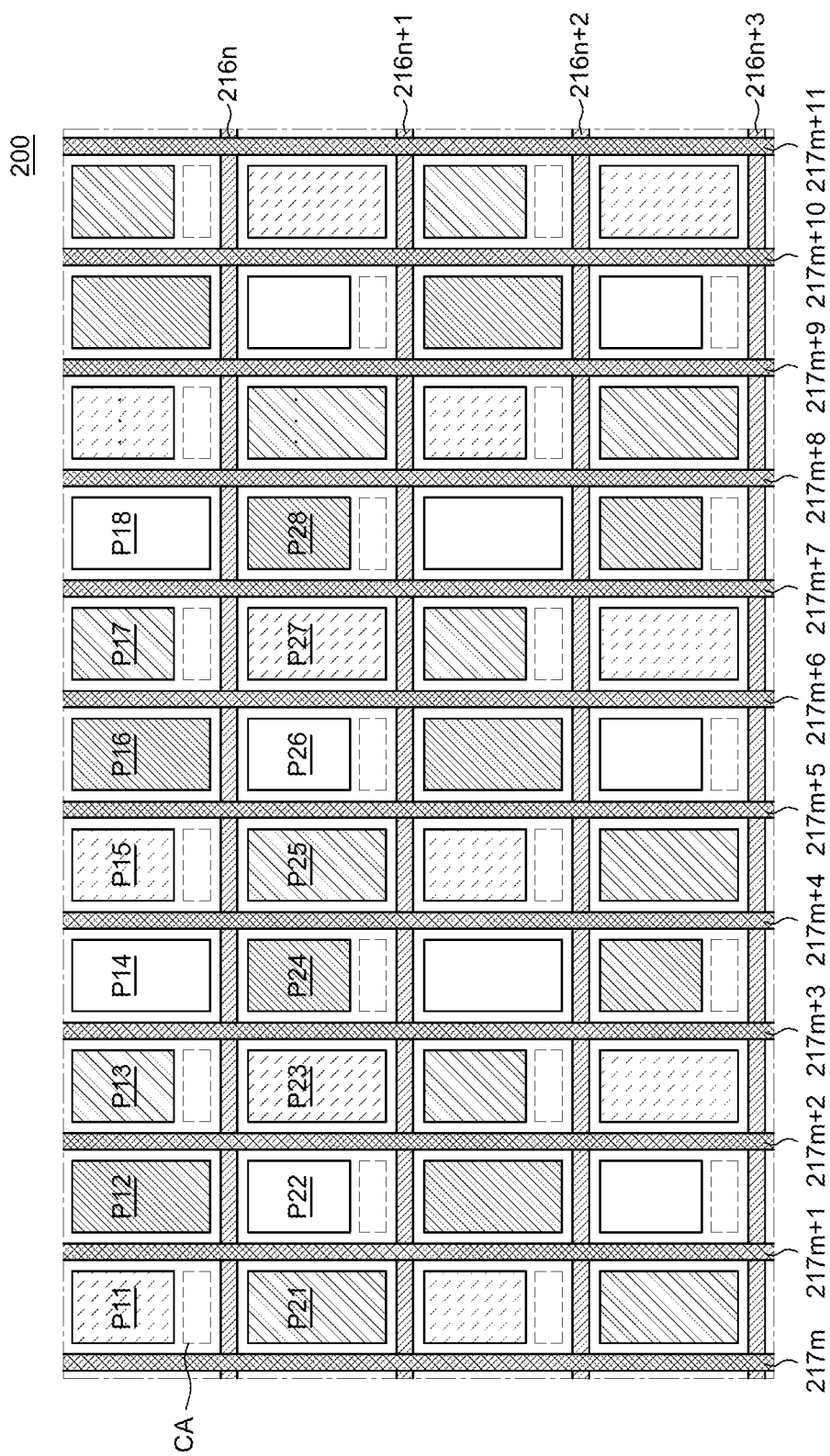
FIG. 8 is a plan view showing an example of a pixel structure in a liquid-crystal display device according to another exemplary embodiment of the present disclosure.
Figure 9:
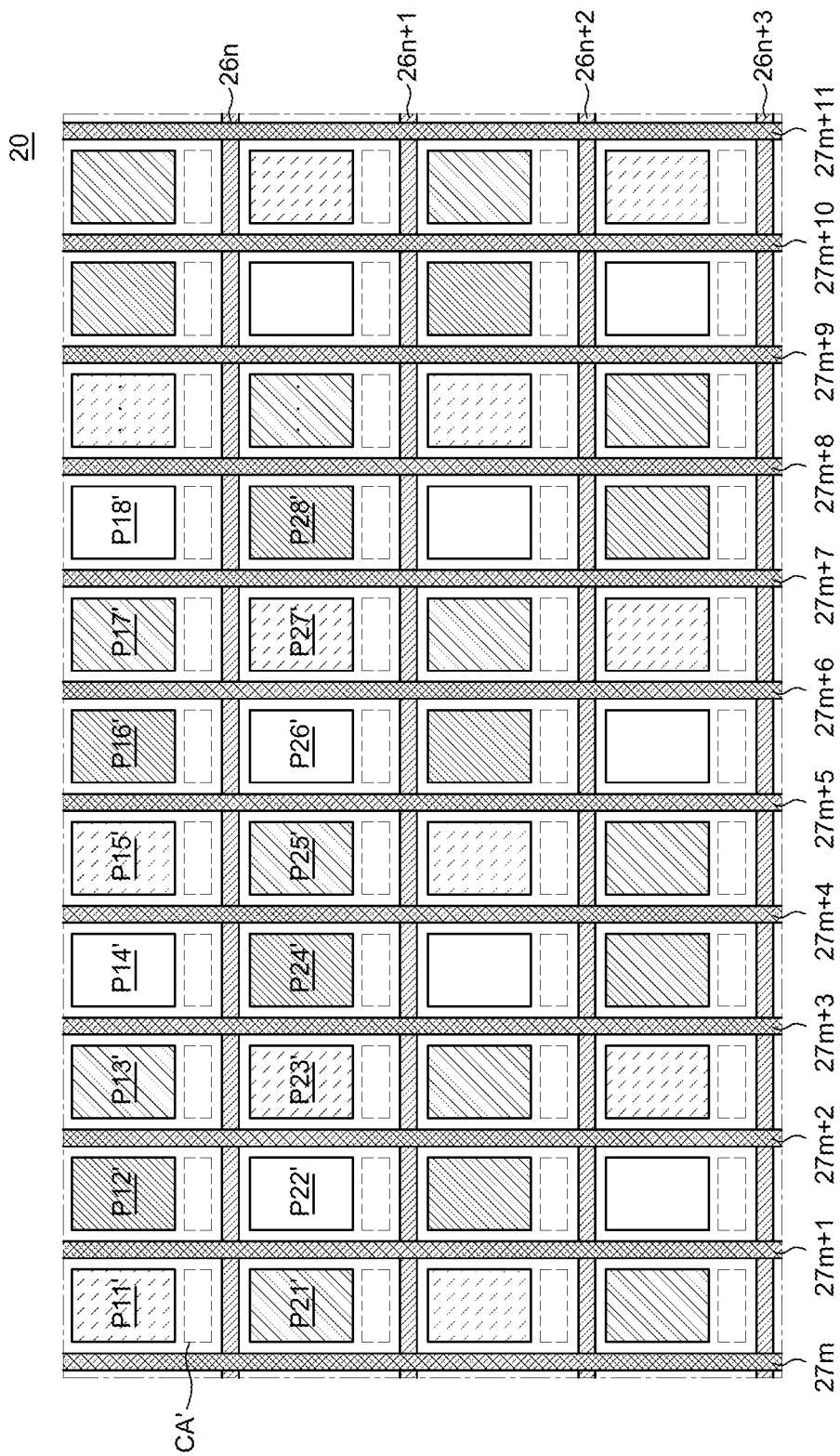
FIG. 9 is a plan view showing an example of a pixel structure in a liquid-crystal display device according to a Comparative Example.

FIG. 8 is a plan view showing an example of a pixel structure in a liquid-crystal display device according to another exemplary embodiment of the present disclosure. FIG. 9 is a plan view showing an example of a pixel structure in a liquid-crystal display device according to a Comparative Example.

Figure 10:
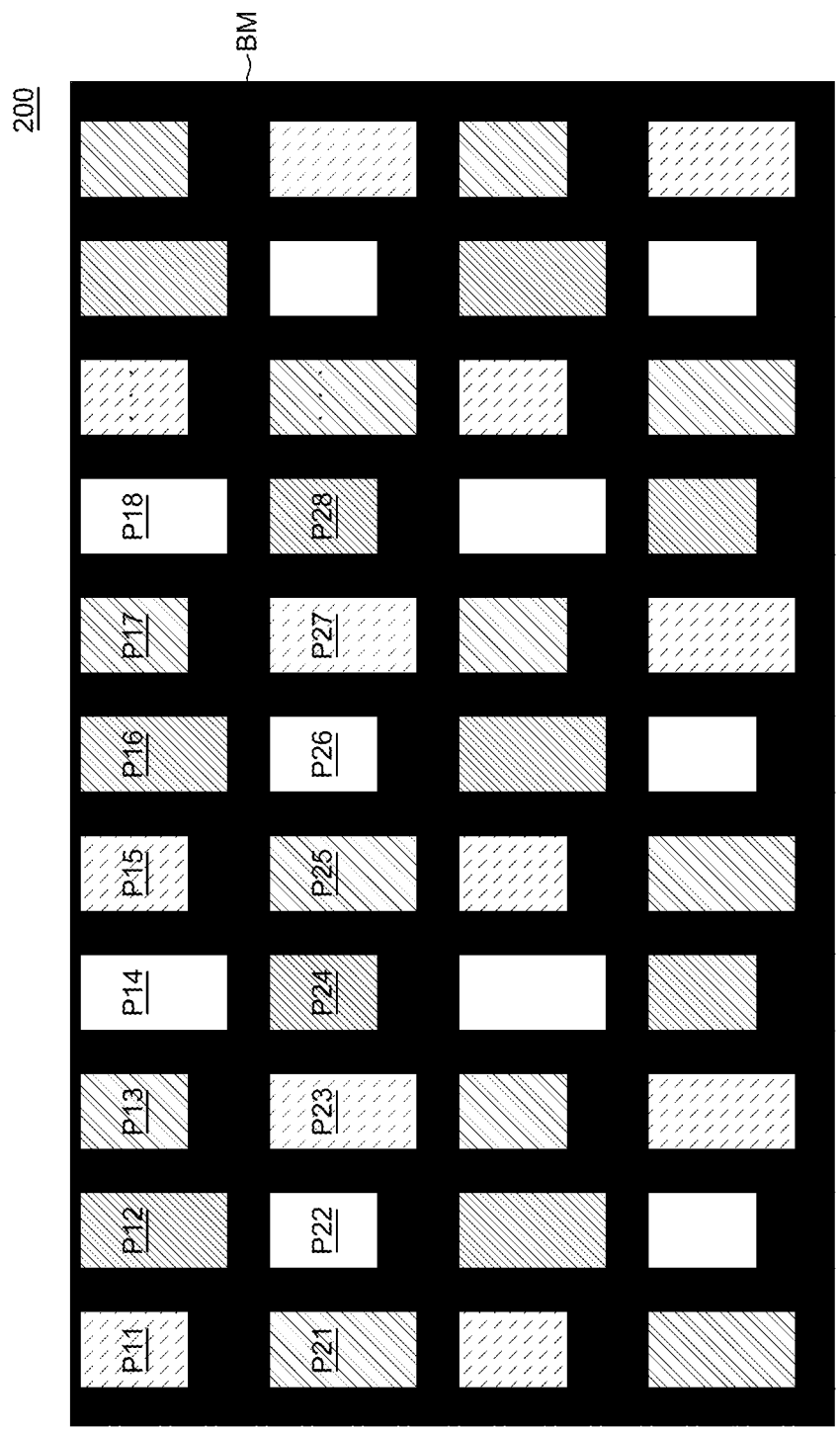
FIG. 10 is a plan view showing an example of a black matrix structure in a liquid-crystal display device according to another exemplary embodiment of the present disclosure.
Figure 11:
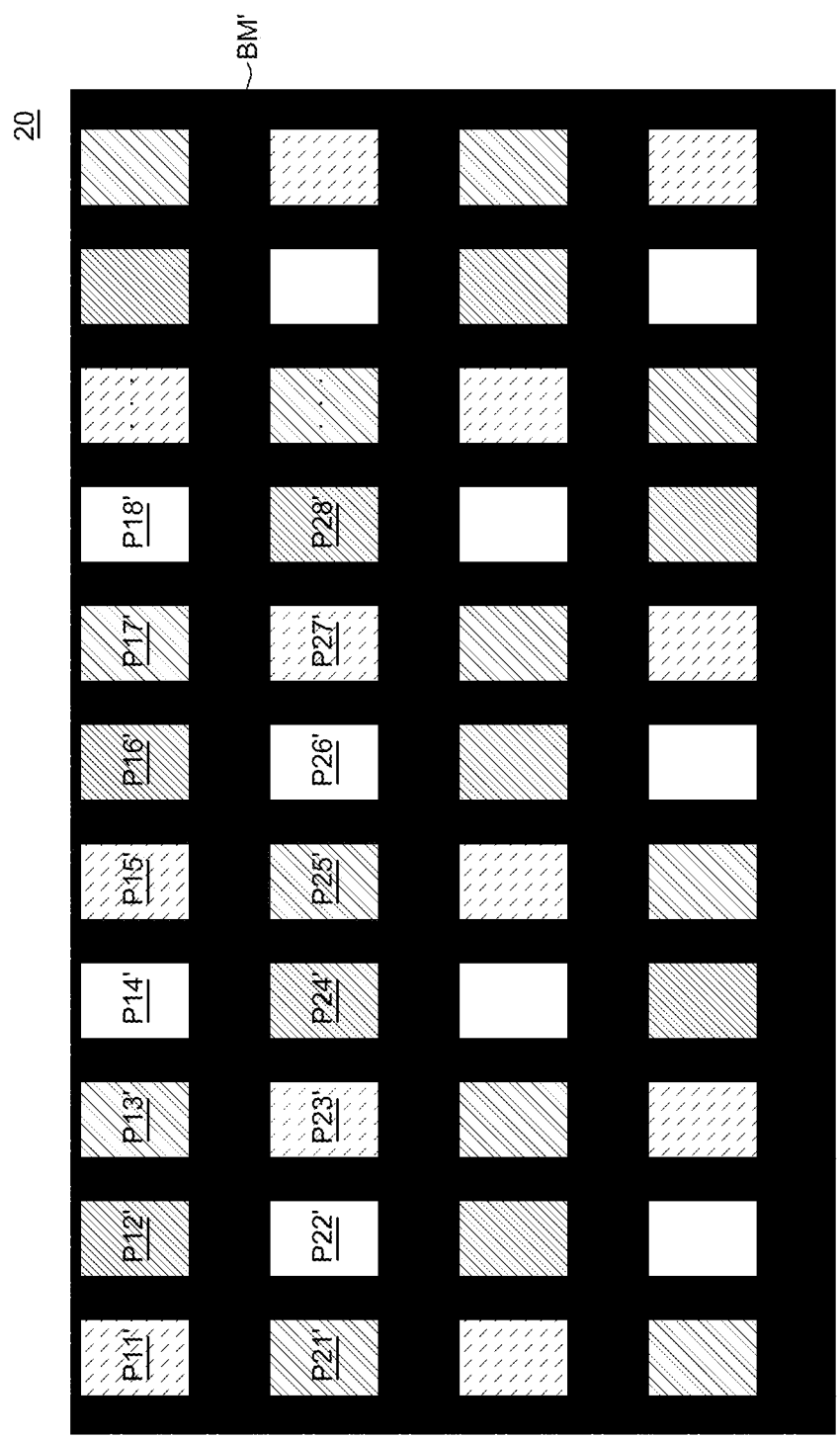
FIG. 11 is a plan view showing an example of a black matrix structure in a liquid-crystal display device according to a Comparative Example.

FIG. 10 is a plan view showing an example of a black matrix structure in a liquid-crystal display device according to another exemplary embodiment of the present disclosure. FIG. 11 is a plan view showing an example of a black matrix structure in a liquid-crystal display device according to the Comparative Example of FIG. 9.

FIG. 8 shows a planar structure of 44 (=11×4) sub-pixels (P11, P12, P13, P14, P15, P16, P17, P18 ..., P21, P22, P23, P24, P25, P26, P27, P28 ...,) in a liquid-crystal display device 200 according to another exemplary embodiment of the present disclosure. It is, however, to be understood that the present disclosure is not limited thereto. FIG. 9 shows a planar structure of an example of 44 (=11×4) sub-pixels (P11', P12', P13', P14', P15', P16', P17', P18' ..., P21', P22', P23', P24', P25', P26', P27', P28', ...) in a liquid-crystal display device according to the Comparative Example.

It is to be noted that among the sub-pixels (P11, P12, P13, P14, P15, P16, P17, P18, ..., P21, P22, P23, P24, P25, P26, P27, P28, ...), sub-pixels having the same hatching produce the light of the same color. FIG. 8 shows an example where the sub-pixels (P11, P12, P13, P14, P15, P16, P17, P18, ..., P21, P22, P23, P24, P25, P26, P27, P28, ...) include red sub-pixels, green sub-pixels, blue sub-pixels, and white sub-pixels.

FIG. 10 shows a black matrix (BM) structure of 44 (=11×4) sub-pixels (P11, P12, P13, P14, P15, P16, P17, P18, ..., P21, P22, P23, P24, P25, P26, P27, P28, ...) in the liquid-crystal display device 200 according to the exemplary embodiment of the present disclosure. It is, however, to be understood that the present disclosure is not limited thereto. FIG. 11 shows an example of a black matrix BM' structure in a liquid-crystal display device 20 according to the Comparative Example of FIG. 9, which includes 44 (=11×4) sub-pixels (P11', P12', P13', P14', P15', P16', P17', P18' ..., P21', P22', P23', P24', P25', P26', P27', P28', ...).

Referring to FIG. 8, a liquid-crystal display device 200 according to another exemplary embodiment of the present disclosure may include a plurality of sub-pixels (P11, P12, P13, P14, P15, P16, P17, P18, ..., P21, P22, P23, P24, P25, P26, P27, P28, ...). In the following description, 44 (=11×4) sub-pixels (P11, P12, P13, P14, P15, P16, P17, P18, ..., P21, P22, P23, P24, P25, P26, P27, P28, ...) will be described for convenience of illustration. It is, however, to be understood that the present disclosure is not limited thereto.

The sub-pixels (P11, P12, P13, P14, P15, P16, P17, P18, ..., P21, P22, P23, P24, P25, P26, P27, P28, ...) may be disposed in a matrix as the gate lines 216n, 216(n+1), 216(n+2), 216(n+3) and the data lines (217m, 217(m+1), 217(m+2), 217(m+3), 217(m+4), 217(m+5), 217(m+6), 217(m+7), 217(m+8), 217(m+9), 217(m+10) and 217(m+11)) overlap one another on the lower substrate.

The gate lines 216n, 216(n+1), 216(n+2) and 216(n+3) are arranged on the lower substrate in the first direction. The data lines 217m, 217(m+1), 217(m+2), 217(m+3), 217(m+4), 217(m+5), 217(m+6), 217(m+7), 217(m+8), 217(m+9), 217(m+10) and 217(m+11) are arranged in the second direction intersecting the first direction to define the sub-pixels (P11, P12, P13, P14, P15, P16, P17, P18, . . . , P21, P22, P23, P24, P25, P26, P27, P28, . . . ) together with the gate lines 216n, 216(n+1), 216(n+2) and 216(n+3).

In the liquid-crystal crystal display device 200 according to this exemplary embodiment of the present disclosure, a red sub-pixel, a green sub-pixel, a blue sub-pixel, and a white sub-pixel may be arranged repeatedly and sequentially in each of the rows. For example, the sub-pixels P11, P12, P13, P14, P15, P16, P17, P18, . . . in the $n^{th}$ row may be the red sub-pixels P11, P15, . . . , the green sub-pixels P12, P16, . . . , the blue sub-pixels P13, P17, . . . , and white sub-pixels P14, P18, . . . may be arranged repeatedly and sequentially. It is, however, to be understood that the present disclosure is not limited thereto.

In addition, the sub-pixels in the same column may be the sub-pixels of two different colors, e.g., a red sub-pixel and a blue sub-pixel or a green sub-pixel and a white sub-pixel arranged repeatedly. For example, in the $m^{th}$ column, the red sub-pixels P11 and P31 and the blue sub-pixels P21 and P41 are repeatedly arranged. In the $(m+1)^{th}$ column, the green sub-pixels P12 and P32 and the white sub-pixels P22 and P42 are repeatedly arranged. It is, however, to be understood that the present disclosure is not limited thereto.

In the liquid-crystal display device 100 according to the above-described exemplary embodiment of the present disclosure, two thin-film transistors for two sub-pixels next to each other in the horizontal direction among the sub-pixels (P11, P12, P13, P14, P15, P16, P17, P18, . . . , P21, P22, P23, P24, P25, P26, P27, P28, . . . ) are disposed together in the circuit area CA of one of the two adjacent sub-pixels, such that the sub-pixels are designed asymmetrically. It can be seen that the aperture area of the others of the two sub-pixels P12, P14, P16, P18, . . . , P21, P23, P25, P27, . . . where no thin-film transistor is disposed can be increased by the area equal to the circuit area CA, and thus the width or area of the black matrix BM, as shown in FIG. 10 decreases.

Such asymmetric structure of the sub-pixels (P11, P12, P13, P14, P15, P16, P17, P18, . . . , P21, P22, P23, P24, P25, P26, P27, P28, . . . ) may be repeated in the same row sub-pixels and also in the same column sub-pixels.

Referring to FIG. 9, in the liquid-crystal display device 20 according to the Comparative Example, the sub-pixels P11', P12', P13', P14', P15', P16', P17', P18', . . . , P21', P22', P23', P24', P25', P26', P27', P28', . . . may be disposed in a matrix as the gate lines 26n, 26(n+1), 26(n+2) and 26(n+3) and the data lines 27m, 27(m+1), 27(m+2), 27(m+3), 27(m+4), 27(m+5), 27(m+6), 27(m+7), 27(m+8), 27(m+9), 27(m+10) and 27(m+11) overlap one another on the lower substrate.

In the liquid-crystal display device 20 according to the Comparative Example of FIG. 9, it can be seen that a thin-film transistor is disposed in each of the sub-pixels P11', P12', P13', P14', P15', P16', P17', P18', . . . , P21', P22', P23', P24', P25', P26', P27', P28' . . . , such that the circuit area CA' is disposed in every sub-pixel. That is to say, the circuit area CA' has the symmetric structure. In this structure, it can be seen that the aperture area is reduced by the area equal to the circuit area CA', and accordingly the width or the area of the black matrix BM' as shown in FIG. 11 is increased. As a result, the aperture ratio and the transmittance are decreased.

The exemplary embodiments of the present disclosure can also be described as follows:

According to an aspect of the present disclosure, there is provided a liquid-crystal display device. The liquid-crystal display device includes gate lines and data lines disposed on a substrate and overlapping with one another to define sub-pixels, two thin-film transistors disposed together in a circuit area of one of two sub-pixels next to each other in a horizontal direction among the sub-pixels and common electrodes and pixel electrodes disposed alternately in each of the sub-pixels, wherein the two thin-film transistors are connected to the two sub-pixels, respectively.

The liquid-crystal display device may further include color filters disposed in the sub-pixels and a light-blocking layer disposed at a boundary between two of the sub-pixels next to each other in a vertical direction and comprising at least one of the color filters.

The light-blocking layer may be formed by stacking a blue color filter on a red color filter.

The liquid-crystal display device may further include a common line disposed between a lower side of each of the sub-pixels and the respective gate lines and extended in a direction parallel to the gate lines.

The liquid-crystal display device may further include a first light-blocking line disposed on at least one side of each of the data lines and connected to the common line and a second light-blocking line disposed above each of the data lines so as to cover it.

The liquid-crystal display device may further include a first pixel electrode connection portion disposed in the circuit area of the one of the two sub-pixels and connected to a pixel electrode thereof pixels through a first contact hole and a second pixel electrode connection portion connected to a pixel electrode of the other of the two sub-pixels through a second contact hole.

The second pixel electrode connection portion may be connected to the pixel electrode of the other of the two sub-pixels via one of the data lines disposed between the two sub-pixels.

The sub-pixels may comprise a red sub-pixel, a green sub-pixel and a blue sub-pixel, wherein the red sub-pixel, the green sub-pixel and the blue sub-pixel are arranged repeatedly and sequentially in each of rows, and wherein sub-pixels of the same color among the red sub-pixel, the green sub-pixel and the blue sub-pixel are arranged repeatedly in each of columns.

The sub-pixels may comprise a red sub-pixel, a green sub-pixel, a blue sub-pixel and a white sub-pixel, wherein the red sub-pixel, the green sub-pixel, the blue sub-pixel and the white sub-pixel are arranged repeatedly and sequentially in each of rows, and wherein sub-pixels of two different colors are arranged repeatedly in each of columns.

The sub-pixels of the two different colors may be the red sub-pixel and the blue sub-pixel or the green sub-pixel and the white sub-pixel.

According to another aspect of the present disclosure, there is provided a liquid-crystal display device. The liquid-crystal display device includes gate lines and data lines disposed on a substrate and overlapping with one another to define sub-pixels, two thin-film transistors disposed together in a circuit area of one of two sub-pixels next to each other in a horizontal direction among the sub-pixels and common electrodes and pixel electrodes disposed alternately in each of the sub-pixels, wherein the two thin-film transistors are disposed together in the circuit area of the one of the two sub-pixels whereas no thin-film transistor is disposed in a circuit area of the other of the two sub-pixels, such that the sub-pixels have an asymmetric structure.

The liquid-crystal display device may further include color filters disposed in the sub-pixels and a light-blocking layer disposed at a boundary between two of the sub-pixels next to each other in a vertical direction and comprising at least one of the color filters.

The liquid-crystal display device may further include a common line disposed between a lower side of each of the sub-pixels and the respective gate lines and extended in a direction parallel to the gate lines.

The two thin-film transistors may be connected to the two sub-pixels, respectively.

The liquid-crystal display device may further include a first pixel electrode connection portion disposed in the circuit area of the one of the two sub-pixels and connected to a pixel electrode thereof pixels through a first contact hole and a second pixel electrode connection portion connected to a pixel electrode of the other of the two sub-pixels through a second contact hole.

The second pixel electrode connection portion may be connected to the pixel electrode of the other of the two sub-pixels via one of the data lines disposed between the two sub-pixels.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a substrate;
a plurality of sub-pixels disposed on the substrate in a horizontal direction and a vertical direction;
gate lines and data lines disposed on the substrate and overlapping with one another to separate the sub-pixels from each other;
two thin-film transistors disposed together in a circuit area of one of two sub-pixels aligned with each other in the horizontal direction among the sub-pixels; and
common electrodes and pixel electrodes disposed alternately in each of the sub-pixels,
wherein the two thin-film transistors are electrically coupled to the two sub- pixels, respectively,
wherein the plurality of sub-pixels include a row of sub-pixels which is a group of sub-pixels arranged in a row direction among the plurality of the sub-pixels and a column of sub-pixels which is a group of sub-pixels arranged in a column direction among the plurality of the sub-pixels, and
wherein two adjacent sub-pixels of the row of sub-pixels aligned with each other in a horizontal direction have different lengths from each other in the column direction and two adjacent sub-pixels of the column of sub-pixels aligned with each other in a vertical direction have different lengths from each other in the column direction.

2. The device of claim 1, further comprising:
color filters disposed in the sub-pixels; and
a light-blocking layer disposed at a boundary between two sub-pixels aligned with each other in a vertical direction among the sub-pixels, the light-blocking layer including at least one of the color filters.

3. The device of claim 2, wherein the light-blocking layer includes a blue color filter on a red color filter.

4. The device of claim 1, further comprising:
a common line disposed between a lower side of the sub-pixels and the gate lines, the common line extending in a direction parallel to the gate lines.

5. The device of claim 4, further comprising:
a first light-blocking line disposed on at least one side of each of the data lines, the first light-blocking line being electrically coupled to the common line; and
a second light-blocking line disposed above each of the data lines.

6. The device of claim 1, further comprising:
a first pixel electrode connection portion disposed in the circuit area of the one of the two sub-pixels, the first pixel electrode connection portion being electrically coupled to a pixel electrode of the one of the two sub-pixels, the first pixel electrode connection portion extending through a first contact hole; and
a second pixel electrode connection portion electrically coupled to a pixel electrode of the other of the two sub-pixels, the second pixel electrode connection portion extending through a second contact hole.

7. The device of claim 6, wherein the second pixel electrode connection portion is electrically coupled to the pixel electrode of the other of the two sub-pixels via one of the data lines disposed between the two sub-pixels.

8. The device of claim 1, wherein the sub-pixels includes red sub- pixels, green sub-pixels, and blue sub-pixels, wherein the red sub-pixels, the green sub-pixels, and the blue sub-pixels are arranged repeatedly and sequentially in each of a plurality of rows, and wherein sub-pixels of the same color among the red sub-pixels, the green sub-pixels, and the blue sub-pixels are arranged repeatedly in each of a plurality of columns.

9. The device of claim 1, wherein the sub-pixels includes red sub- pixels, green sub-pixels, blue sub-pixels, and white sub-pixels, wherein the red sub-pixels, the green sub-pixels, the blue sub-pixels, and the white sub-pixels are arranged repeatedly and sequentially in each of a plurality of rows, and wherein sub-pixels of two different colors are arranged repeatedly in each of a plurality of columns.

10. The display of claim 9, wherein the sub-pixels of the two different colors are the red sub-pixel and the blue sub-pixel, or the green sub-pixel and the white sub-pixel.

11. The display device of claim 1, wherein the display is a liquid crystal display.

12. A display device, comprising:
a substrate;
a plurality of sub-pixels disposed on the substrate in a horizontal direction and a vertical direction;

gate lines and data lines disposed on the substrate and overlapping with one another to separate the sub-pixels from each other;

two thin-film transistors disposed together in a circuit area of one of two sub-pixels aligned with each other in -a the horizontal direction among the sub-pixels; and common electrodes and pixel electrodes disposed alternately in each of the sub-pixels, wherein the two thin-film transistors are disposed together in the circuit area of the one of the two sub-pixels and no thin-film transistor is disposed in a circuit area of the other of the two sub-pixels, wherein the plurality of sub-pixels include a row of sub-pixels which is a group of sub-pixels arranged in a row direction among the plurality of the sub-pixels and a column of sub-pixels which is a group of sub-pixels arranged in a column direction among the plurality of the sub-pixels, and wherein two adjacent sub-pixels aligned with each other in a horizontal direction have different lengths from each other in the column direction and two adjacent sub-pixels aligned with each other in a vertical direction have different lengths from each other in the column direction.

13. The device of claim 12, further comprising:
color filters disposed in the sub-pixels; and
a light-blocking layer disposed at a boundary between two sub-pixels aligned with each other in a vertical direction among the sub-pixels, the light-blocking layer including at least one of the color filters.

14. The device of claim 13, further comprising:
a common line disposed between a lower side of the sub-pixels and the gate lines, the common line extending in a direction parallel to the gate lines.

15. The device of claim 12, wherein the two thin-film transistors are electrically coupled to the two sub-pixels, respectively.

16. The device of claim 12, further comprising:
a first pixel electrode connection portion disposed in the circuit area of the one of the two sub-pixels, the first pixel electrode connection portion being electrically coupled to a pixel electrode of the one of the two sub-pixels, the first pixel electrode connection portion extending through a first contact hole; and
a second pixel electrode connection portion electrically coupled to a pixel electrode of the other of the two sub-pixels, the second pixel electrode connection portion extending through a second contact hole.

17. The device of claim 16, wherein the second pixel electrode connection portion is electrically coupled to the pixel electrode of the other of the two sub-pixels via one of the data lines disposed between the two sub-pixels.

18. The device of claim 12 wherein the two sub-pixels are asymmetrical with each other.

19. The display device of claim 11, wherein the display is a liquid crystal display.

\* \* \* \* \*